United States Patent
Hirano (10) Patent No.: US 7,032,309 B2
(45) Date of Patent: Apr. 25, 2006

(54) METHOD FOR REINFORCING THE CONNECTION OF FLAT CABLE MEMBER AND METHOD FOR MANUFACTURING IMAGE DISPLAY UNIT

(75) Inventor: Koji Hirano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 10/861,256

(22) Filed: Jun. 4, 2004

(65) Prior Publication Data

US 2005/0015976 A1    Jan. 27, 2005

(30) Foreign Application Priority Data

Jun. 6, 2003   (JP)   ............................. 2003-161855
Jun. 1, 2004   (JP)   ............................. 2004-162955

(51) Int. Cl.
*H01R 43/00*   (2006.01)

(52) U.S. Cl. ............................. 29/854; 29/825; 29/832; 29/857

(58) Field of Classification Search .................. 29/846, 29/848, 854, 858, 825, 832, 857; 439/66, 439/86, 91

See application file for complete search history.

(56) References Cited

U.S. PATENT DOCUMENTS

| 4,770,641 | A | * | 9/1988 | Rowlette ....................... 439/86 |
| 4,884,010 | A |   | 11/1989 | Biberian ....................... 315/366 |
| 5,037,312 | A | * | 8/1991 | Casciotti et al. .............. 439/66 |
| 5,066,883 | A |   | 11/1991 | Yoshioka et al. ........... 313/309 |
| 5,074,799 | A | * | 12/1991 | Rowlette, Sr. ............... 439/91 |
| 5,123,849 | A | * | 6/1992 | Deak et al. .................... 439/66 |
| 5,129,833 | A | * | 7/1992 | Rowlette, Sr. ............... 439/91 |
| 5,348,686 | A | * | 9/1994 | Vyas ........................... 252/514 |
| 5,738,530 | A | * | 4/1998 | Schreiber et al. ............. 439/66 |
| 5,855,063 | A | * | 1/1999 | Schreiber et al. ............. 29/848 |
| 5,905,638 | A | * | 5/1999 | MacDonald et al. ........ 361/769 |

FOREIGN PATENT DOCUMENTS

JP              63-314866        12/1988

* cited by examiner

*Primary Examiner*—Carl J. Arbes
(74) *Attorney, Agent, or Firm*—Fitzpatrick, Cella, Harper & Scinto (57) ABSTRACT

The present invention discloses a method for reinforcing the connection between a wire formed on a substrate and a flat cable member with a reinforcing material. The method includes the step of supplying fluid and the step of hardening the fluid to form the reinforcing material. The step of supplying the fluid includes the step of bringing the substrate connecting to the flat cable member close to a jig and then supplying the fluid to a region in which the reinforcing material is to be formed while preventing the outflow of the fluid with the jig.

9 Claims, 9 Drawing Sheets

METHOD FOR REINFORCING THE CONNECTION OF FLAT CABLE MEMBER AND METHOD FOR MANUFACTURING IMAGE DISPLAY UNIT

BACKGROUND OF THE INVENTION

1. Field of the Invention

The present invention relates to a method for reinforcing the connection of a flat cable member and a method for manufacturing an image display unit using the flat cable member.

2. Description of the Related Art

Flat image forming apparatus constructed of an anode substrate (hereinafter, referred to as a face plate) including an anode electrode and a cathode substrate (hereinafter, referred to as a rear plate) including a cathode electrode are widely researched and developed in recent years. Examples of electron sources for use are those using field emission elements or surface-conductive electron emission elements. An example of the apparatus using the field emission elements is disclosed in U.S. Pat. No. 4,884,010. An example of the apparatus using the surface-conductive electron emission elements is disclosed in U.S. Pat. No. 5,066,883.

The display is not necessarily the aforesaid display using the field emission elements but various displays such as liquid-crystal displays, plasma displays, and EL displays are known.

The image forming apparatus include wires for display control such as wires for driving display elements. The connection between the wires and external circuits preferably use flat cable members (flat cables) in which multiple wires are bundled into flat shape with insulating substrates so as to insulate the wires from one another. For example, a flexible printed circuit board (FPC) extending to a driving circuit through an anisotropic conductive film (hereinafter, referred to as an ACF) or a tape carrier package (TCP) serving as a tape automated bonding (TAB) tape is connected to the wires.

The metal wires of the flat cable member are easily influenced by external forces or environment, whose migration resistance is decreased by application of voltage, thereby becoming incapable of maintaining the insulation between the adjacent wires.

Japanese Patent Laid-Open No. 06-314,866 discloses a method for forming a flexible printed-circuit board having a plurality of holes passing though in the direction of the thickness of a film protector on the periphery of a connecting conductor of a connection terminal connecting to a wiring pattern of the substrate of the display panel, the method comprising a soldering step of connecting the connecting conductor of the connection terminal of the flexible printed-circuit board with the wiring pattern of the substrate and a resin sealing step of filling up the connection terminal of the flexible printed-circuit board connected in the soldering step with insulative resin through the holes to form a resin sealed section so as to coat the soldered connection (refer to FIGS. 1A and 1B, 3A to 3C, and 4A to 4D).

SUMMARY OF THE INVENTION

It is an object of the present invention to provide a new method for easily manufacturing a structure using a flat cable member, which resists an external force to the connection, and/or a structure which resists being influenced by an external atmosphere.

The method for reinforcing the connection of a flat cable member according to the present invention is as follows: The method is for reinforcing the connection between a wire formed on a substrate and a flat cable member with a reinforcing material. The method includes the step of supplying fluid and the step of hardening the fluid to form the reinforcing material.

The step of supplying the fluid includes the step of bringing the substrate connecting to the flat cable member close to a jig and then supplying the fluid to a region in which the reinforcing material is to be formed while preventing the outflow of the fluid with the jig.

Further objects, features and advantages of the present invention will become apparent from the following description of the preferred embodiments (with reference to the attached drawings).

DESCRIPTION OF THE PREFERRED EMBODIMENTS

The present invention is directed to a method for reinforcing the connection of a flat cable member. This provides efficient reinforcement. It is preferable to bring a jig into contact with a substrate in order to prevent the outflow of fluid with a jig. However, there may be a slight clearance between the jig and the substrate only if the outflow of the fluid through the clearance can be prevented to a necessary extent.

The process of supplying the fluid preferably include the step of supplying the fluid while preventing the outflow of the fluid with a specified surface of the jig, with the jig and the substrate disposed such that the specified surface of the jig is in nonparallel to a first surface of the substrate to which the flat cable member is connected. The specified surface of the jig may not be flat.

The invention preferably has a structure in which the specified surface, a second surface opposing to the specified surface, and the bottom of a region sandwiched by the surfaces construct a recess and the recess is supplied with the fluid. The second surface may be the surface of the component of the display panel. Specifically, the second surface may be the end face of a frame disposed on the substrate or another substrate disposed to oppose the substrate. The second surface may be provided by a jig. The bottom of the region sandwiched by the specified surface and the second surface opposing to the specified surface may be the first surface or the surface of the jig.

The structure for holding the supplied fluid to prevent it from flowing out preferably includes a recess for holding the supplied fluid. One example of forming the recess includes a structure in which the first surface and the surface of the jig are used as two nonparallel surfaces, wherein the first surface and the surface of the jig are brought into nonparallel with each other by tilting the substrate to form the recess, into which the fluid is to be supplied. This, however, may pose the problem that when the flat cable member is connected to multiple sides of the substrate, the outflow of the fluid can be prevented by one side, while the outflow of the fluid cannot be prevented by the other sides. In that case, although the fluid supplying step and hardening step can be executed for each side, it takes much time. The use of the structure in which the recess is formed by using the second surface offers the advantages in that the fluid can be supplied even if the substrate is not tilted and, even with the structure in which the flat cable member is connected to multiple sides, the fluid can be supplied at the same time. The later-described example adopts this structure.

The invention preferably has a structure in which the end face of the substrate, the specified surface, and the bottom of the region sandwiched by the surfaces construct a recess and the recess is supplied with the fluid. This increases the thickness of the reinforcing material formed under the flat cable member.

The invention preferably has a structure in which the jig has a recessed shape in which the substrate is to be disposed and the wall of the recess is used as the specified surface. Thus, a plurality of the flat cable members connected to multiple sides can be reinforced in sequence or simultaneously with the substrate disposed in the recessed portion. The invention may have a structure in which there is a clearance between the wall surface of the recess and the end face of the substrate and the fluid is supplied to a region surrounded by the bottom of the recess, the wall surface of the recess, and the end face of the substrate. This increases the thickness of the reinforcing material formed under the flat cable member.

The invention preferably has a structure in which the jig is constructed of a lower jig and an upper jig and the fluid is supplied, with the flat cable member released from between the lower jig and the upper jig. To form a thick reinforcing material, it is recommended to increase the height of the jig so that the height for preventing the outflow of the fluid is high. However, when the reinforcement is executed with the flat cable member released onto the jig to form the reinforcing material with the flat cable member released onto the jig, the entire thickness will be increased by the height of the release of the flat cable member. By releasing the flat cable member from between the lower jig and the upper jig, the height of the release of the flat cable member can be decreased and also the outflow of the fluid can be preferably prevented.

The reinforcing material is preferably formed on opposite surfaces of the flat cable member.

When the reinforcing material is formed so as to seal the exposed portion of the conductor of the flat cable member, the wire, or both of them from an atmosphere, reinforcement and sealing can be made at the same time.

The method for reinforcing the connection of the flat cable member according to the invention is preferably applied to a method for manufacturing an image display unit including the step of connecting a flat cable member to a wire formed on the substrate of a display panel and the step of reinforcing the connection connecting to the flat cable member. The later-described examples show its examples.

The flat cable member is preferably an FPC or TCP. The fluid preferably has one of silicone, acryl, polyimide, urethane as-main component.

Embodiments of the present invention will be described hereinafter with reference to the drawings.

First Embodiment

FIGS. 1A to 4D show the outline of a method for reinforcing and sealing the connection between a flexible printed-circuit board (FPC) 3 that is a flat cable member and the substrate of a display panel, according to a first embodiment of the present invention (since a preferred example is shown in the following in which reinforcement and sealing are executed at the same time, the method is simply referred to as a sealing method).

As shown in FIGS. 1A to 4D, a device (jig) for sealing a flat cable member according to the embodiment includes a fluid-flow preventive lower jig 4 having a step 4a for mounting a display panel to which the FPC 3 is connected, a fluid-flow preventive upper jig 5 placed on the upper surface of the fluid-flow preventive lower jig 4 and having an FPC recess 6, and a fluid-applying syringe 11. The display panel which uses the device is a vacuum vessel constructed of a face plate 1 in which a fluorescent layer (not shown) and a metal back (not shown) are formed on a glass substrate and a rear plate 2 having an electron source (not shown) including an electron emitter and a spacer (not shown), which are tightly bonded together in a vacuum chamber. The FPC 3 is connected to the lead-wire electrode section of the display panel by thermo compression bonding etc. and connected to a circuit substrate for driving the display panel.

Figure 1A:
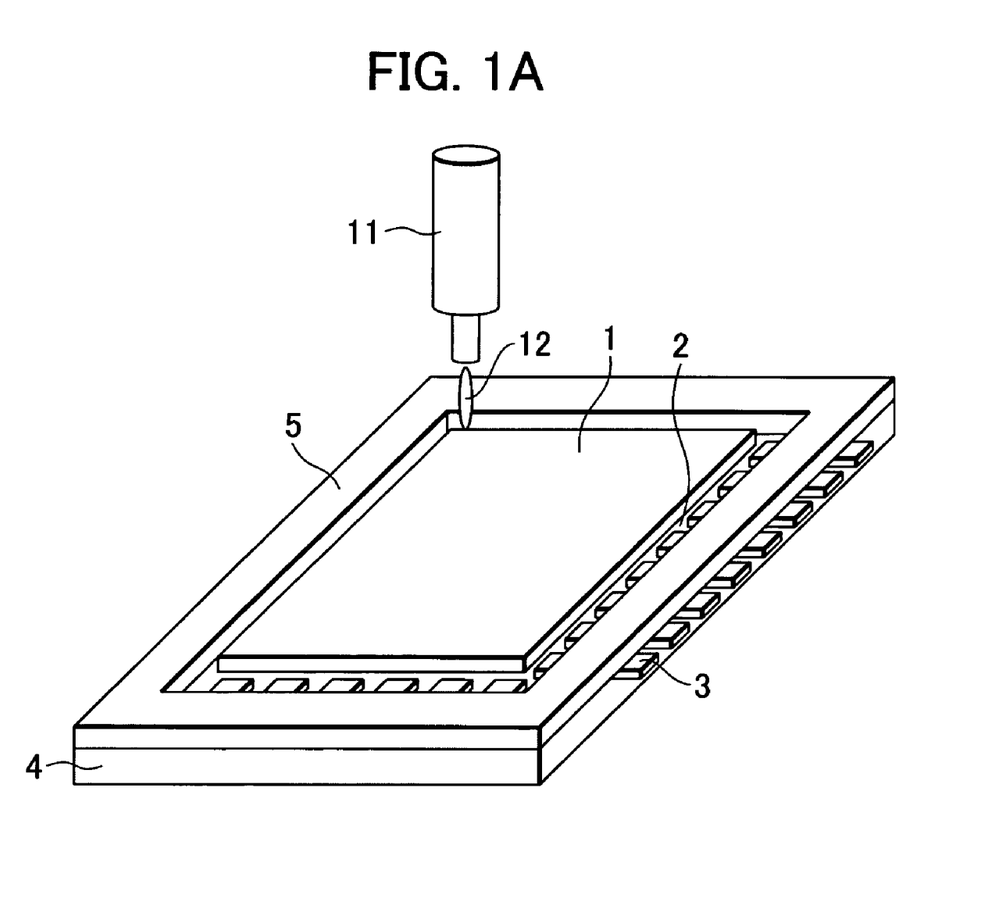
FIG. 1A is a perspective view of a sealing process of the connection of a flat cable member according to a first embodiment of the present invention, particularly showing a fluid coating process.
Figure 2:
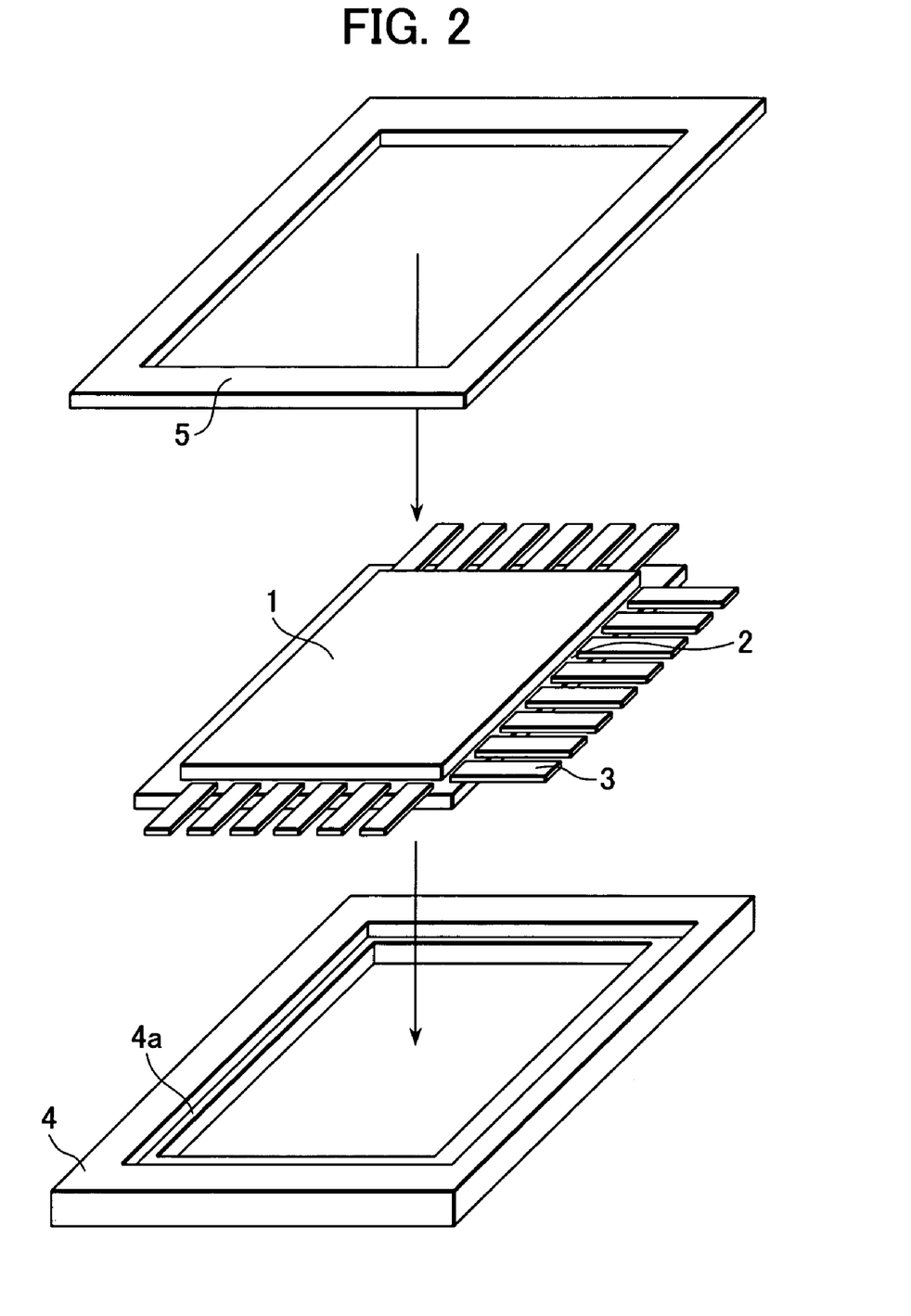
FIG. 2 is an assembly diagram of the jigs used in the process of sealing the connection of a flat cable member according to the first embodiment of the present invention.
Figure 3A:
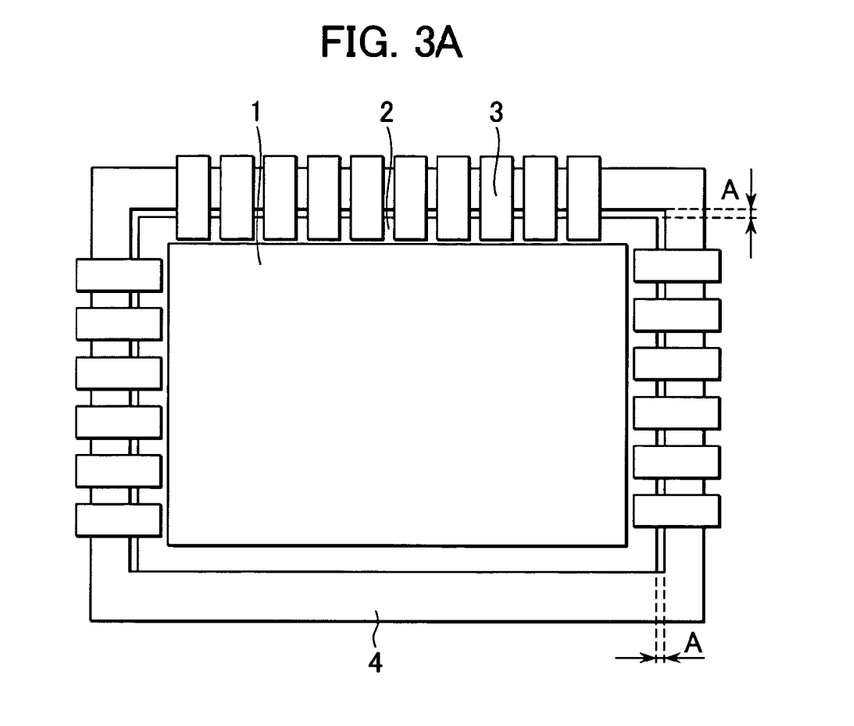
FIG. 3A is a plan view of a lower jig of the jigs used in the process of sealing the connection of a flat cable member according to the first embodiment of the present invention, on which a display panel is mounted.
Figure 3B:
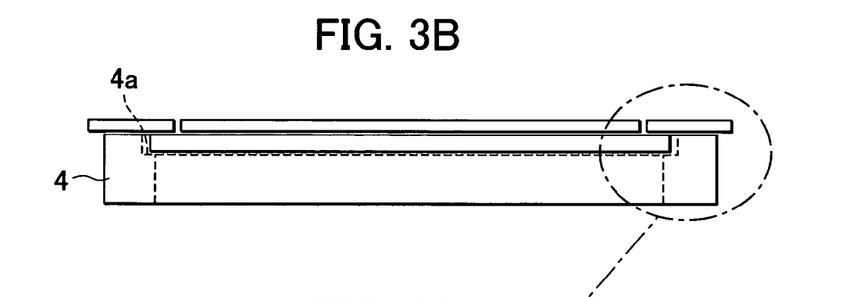
FIG. 3B is a cross-sectional view of the lower jig.
Figure 4A:
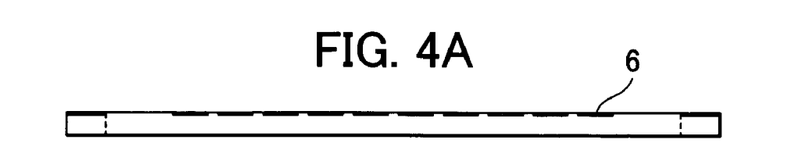
FIG. 4A is a front view of an upper jig of the jigs used in the process of sealing the connection of a flat cable member according to the first embodiment of the present invention, on which a display panel is mounted.
Figures 4B, 4C:
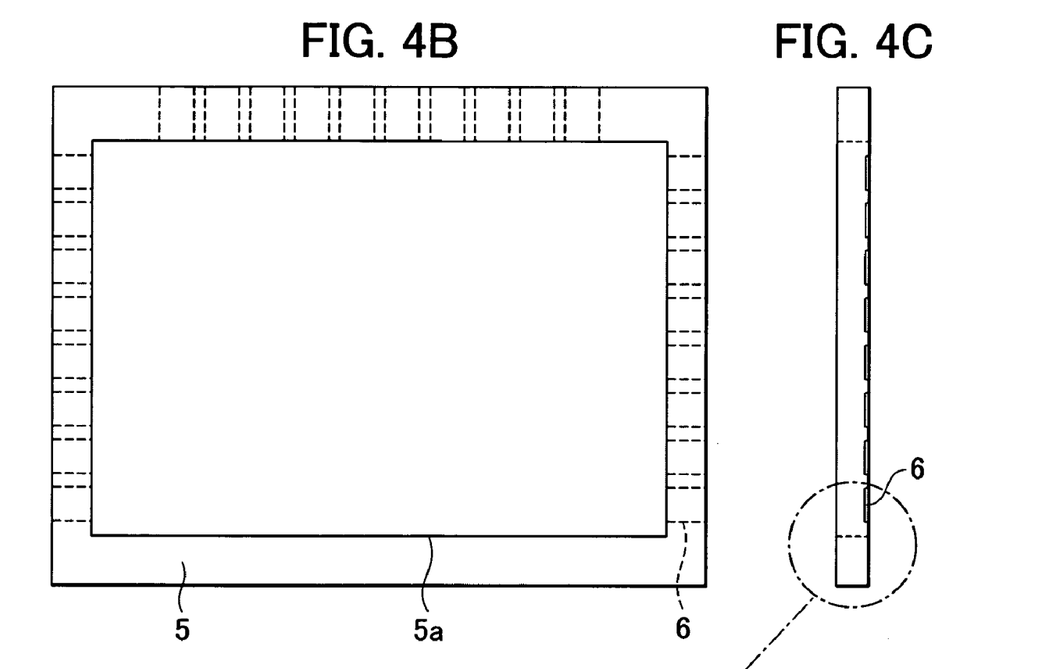
FIG. 4B is a plan view of the upper jig.
FIG. 4C is a side view of the upper jig.
Figure 4D:
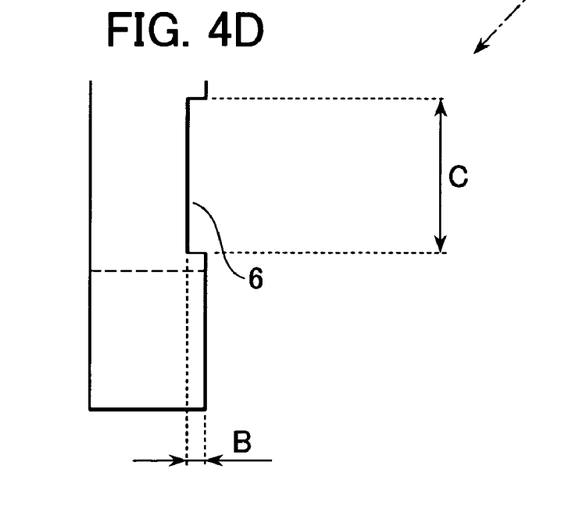
FIG. 4D is a partially enlarged cross-sectional view of the upper jig.

The characteristic of the sealing process of the embodiment is that the fluid-flow preventive lower jig 4 is used in which the step 4a is provided in correspondence with the four sides of the substrate of the display panel to form a recess in which the substrate is to be disposed, as shown in FIG. 3B. The display panel to which the FPC 3 has been connected is placed on the step 4a such that the FPC 3 is placed on the peripheral surface of the recessed step 4a, which are positioned so that clearance A of the order of 1 to 5 mm is formed between the side connected to the FPC 3 and the fluid-flow preventive lower jig 4, as shown in FIG. 3A. The fluid-flow preventive upper jig 5 in which several FPC recesses 6 having a depth B and a width C are formed in sequence, as shown in FIG. 4D, is put over the fluid-flow preventive lower jig 4, as shown in FIGS. 1A to 2. At that time, the FPC connection on the periphery of the display panel is exposed from an opening 5a of the fluid flow preventive upper jig 5.

Figure 1B:
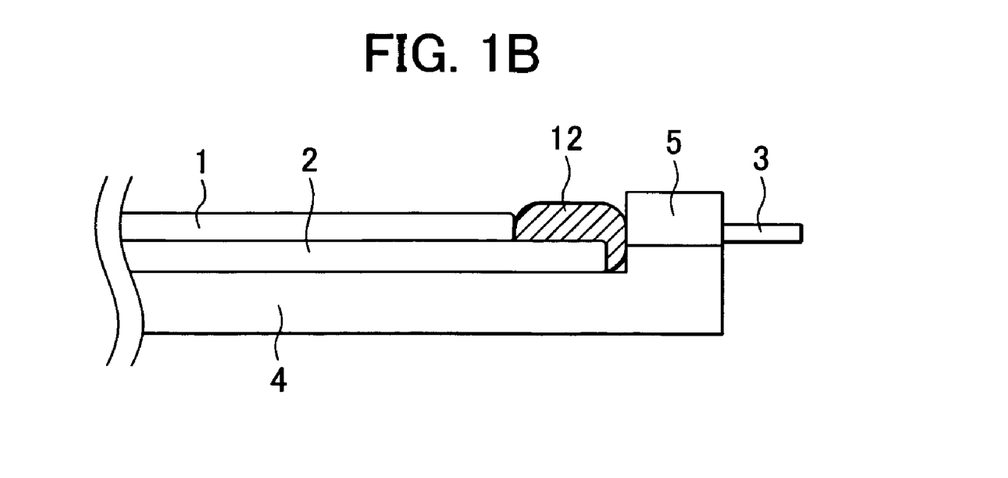
FIG. 1B is a cross-sectional view of jigs on which a display panel is mounted.

As shown in FIGS. 1A and 1B, a fluid 12 is applied to the FPC connection surface on the rear plate 2 around the periphery of the display panel and the clearance A between the display panel and the fluid-flow preventive jigs 4 and 5 with the fluid-applying syringe 11. The applied fluid 12 flows onto a first surface 13 to which the FPC 3 is connected and a second surface (refer to FIG. 3C) which is the back of the FPC 3 by capillary action. At that time, the vertical surface of the fluid-flow preventive lower jig 4 and the vertical surface of the fluid-flow preventive upper jig 5 prevent the outflow of the fluid. Particularly, the fluid is supplied to the recess formed between the surface constructed of the end face of the face plate 1 and the frame between the face plate 1 and the rear plate 2 (the frame is integrated with the face plate 1 in FIG. 1B) and the vertical surfaces of the jigs 4 and 5 and so the fluid is held in the recess. The recess further includes a second recess therein, specifically, a recess defined by the end face of the rear plate 2, the vertical surfaces, and the recessed bottom of the fluid-flow preventive lower jig 4. The fluid flows into the second recess and is hardened to form a reinforcing material having a sufficient thickness on the back of the FPC 3.

Second Embodiment

FIGS. 5A to 8D show the outline of a method for sealing the connection between a TCP that is a flat cable member and the substrate of a display panel, according to a second embodiment of the present invention.

As shown in FIGS. 5A to 8D, a device (jig) for sealing a flat cable member according to the embodiment includes the fluid-flow preventive lower jig 4 having the step 4a for mounting a display panel and a PCB recess 10 for relieving the thickness of a printed circuit board (PCB) 8 connected to the display panel through a TCP 7; the fluid-flow preventive upper jig 5 placed on the upper surface of the fluid-flow preventive lower jig 4 and having the PCB recess 10 and a TCP recess 15 for relieving the thickness of the TCP 7; and the fluid-applying syringe 11. The display panel which uses the device is a vacuum vessel constructed of the face plate 1 in which a fluorescent layer (not shown) and a metal back (not shown) are formed on a glass substrate and the rear plate 2 having an electron source (not shown) including an electron emitter and a spacer (not shown), which are tightly bonded together in a vacuum chamber. A plurality of the TCPs 7 is connected to the lead-wire electrode section of the display panel by thermo compression bonding etc. The PCB 8 that mounts an integrated circuit 9 for driving the display panel is connected to the TCPs 7.

Figure 5A:
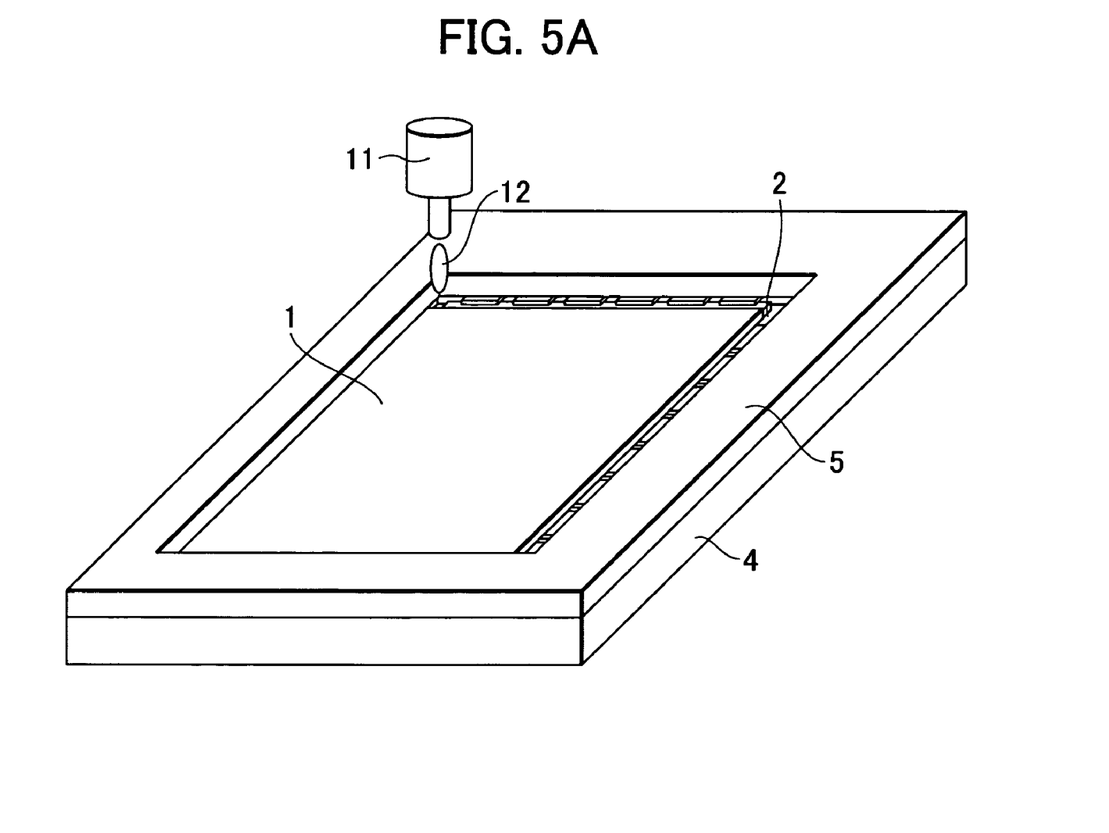
FIG. 5A is a perspective view of a sealing process of the connection of a flat cable member according to a second embodiment of the present invention, particularly showing a fluid coating process.
Figure 6:
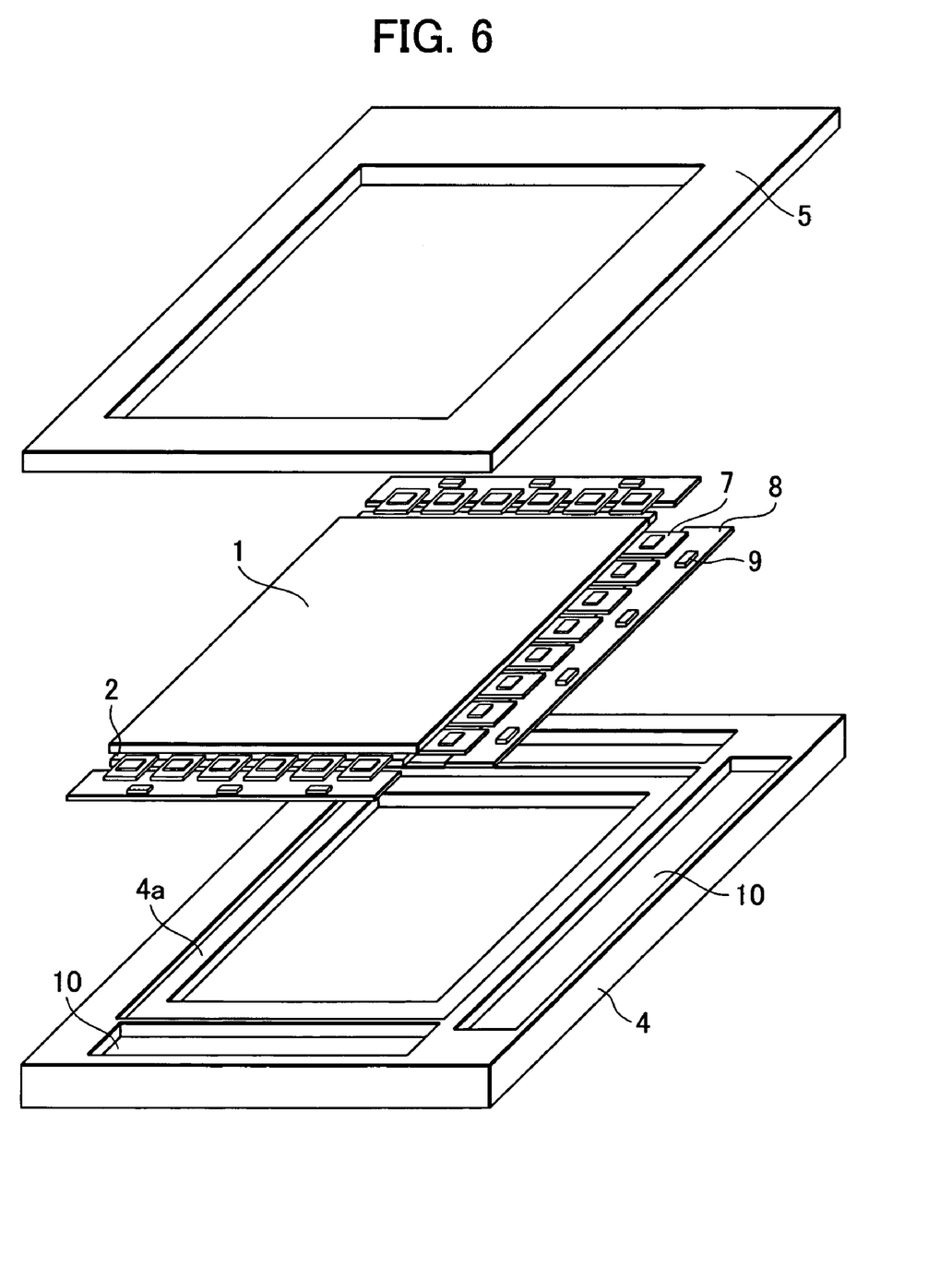
FIG. 6 is an assembly diagram of jigs used in the process of sealing the connection of a flat cable member according to the second embodiment of the present invention.
Figure 7A:
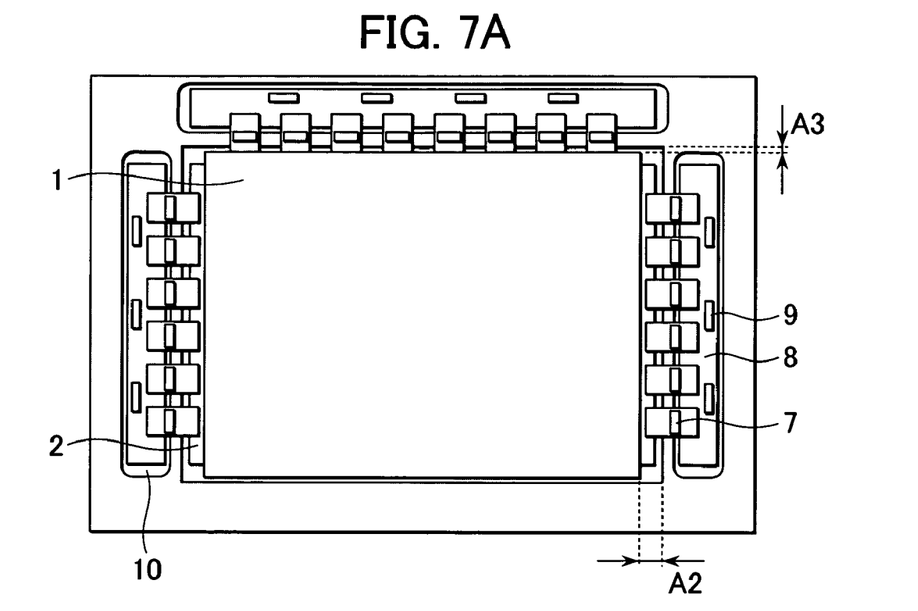
FIG. 7A is a plan view of a lower jig of the jigs used in the process of sealing the connection of a flat cable member according to the second embodiment of the present invention, on which a display panel is mounted.
Figure 7B:
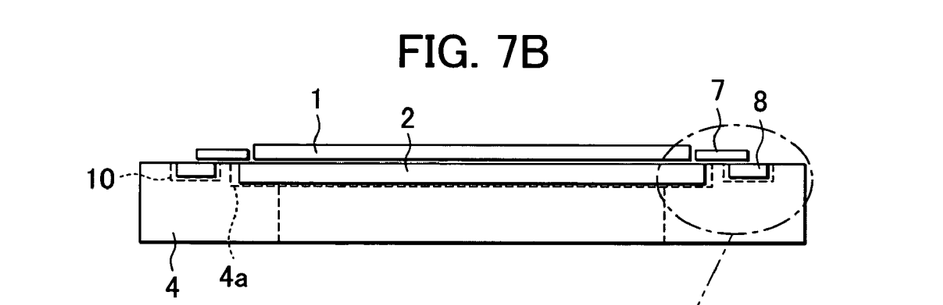
FIG. 7B is a cross-sectional view of the lower jig.
Figure 7C:
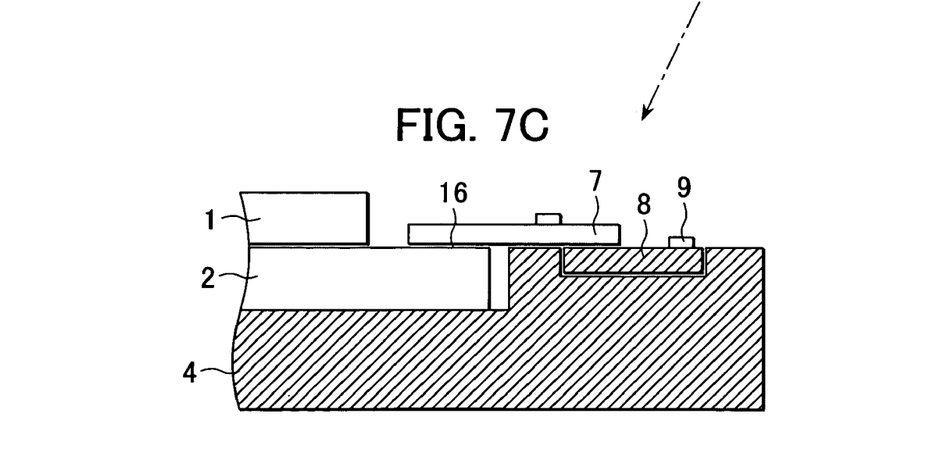
FIG. 7C is a partially enlarged cross-sectional view of the lower jig.
Figure 8A:
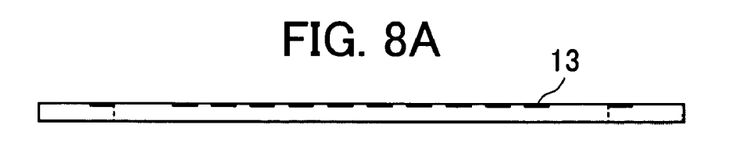
FIG. 8A is a front view of an upper jig of the jigs used in the process of sealing the connection of a flat cable member according to the second embodiment of the present invention, on which a display panel is mounted.
Figure 8B:
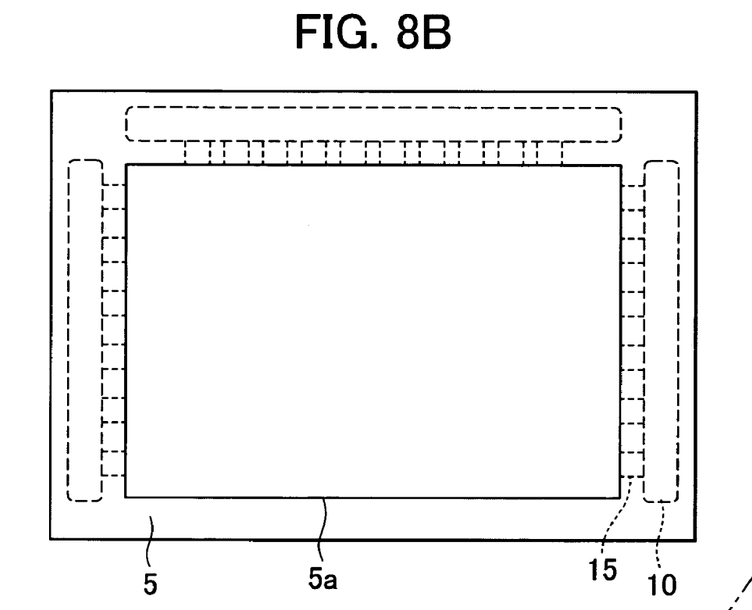
FIG. 8B is a plan view of the upper jig.
Figure 8C:
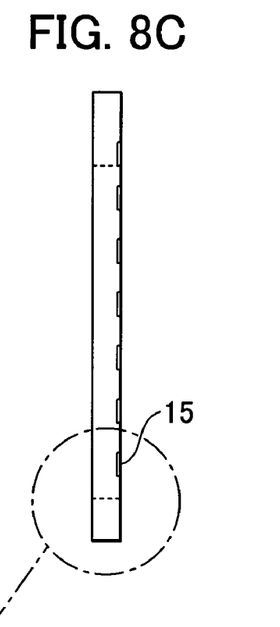
FIG. 8C is a side view of the upper jig.
Figure 8D:
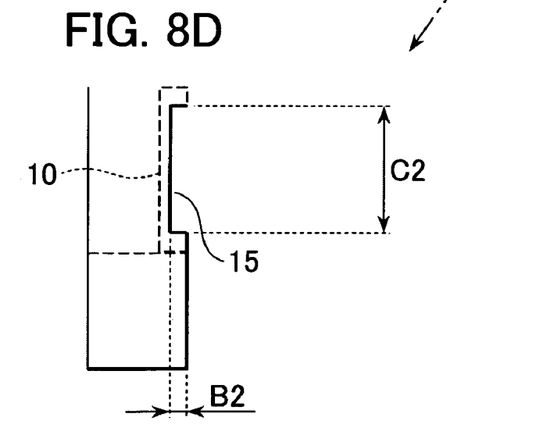
FIG. 8D is a partially enlarged cross-sectional view of the upper jig.

In this embodiment, as shown in FIGS. 6 to 7C, the display panel to which the TCP 7 and the PCB 8 are connected is placed on the step 4a of the fluid-flow preventive lower jig 4 such that the TCP 7 and the PCB 8 are placed on the peripheral surface of the recessed step 4a, which are positioned such that clearances A2 and A3 of the order of 1 to 5 mm are formed between the sides to which the TCP 7 and the PCB 8 are joined and the fluid-flow preventive lower jig 4, as shown in FIG. 7A. As shown in FIG. 8D, the fluid-flow preventive upper jig 5 in which the several TCP recesses 15 having a depth B2 and a width C2 are formed in sequence and the PCB recess 10 is formed so as to connect to the TCP recesses 15 is put over the fluid-flow preventive lower jig 4, as shown in FIGS. 5A to 6. At that time, the TCP connection surface around the periphery of the display panel and the clearances A2 and A3 are exposed from the opening 5a of the fluid-flow preventive upper jig 5.

Figure 5B:
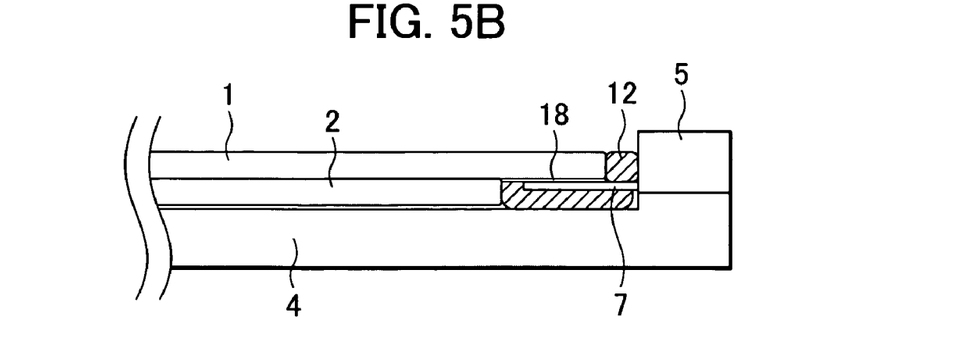
FIG. 5B is a cross-sectional view of jigs on which a display panel is mounted.

As shown in FIG. 5, the fluid 12 is applied to the TCP connection surface on the face plate 1 and the clearances A2 and A3 between the display panel and the fluid-flow preventive jigs 4 and 5 with the fluid-applying syringe 11. The applied fluid 12 flows onto first surfaces 16 and 18 (refer to FIG. 5B and FIG. 7C) to which the TCP 7 is connected and a second surface which is the back of the TCP 7 (refer to FIG. 7C) by capillary action.

According to the foregoing embodiments, when insulative fluid is applied to a display panel to which a flat cable member such as an FPC and a TCP is connected, the use of the fluid-flow preventive jigs 4 and 5 with the above structure prevents the inflow of the fluid to an excess part. Since there is no need to separately carry out the supply of the fluid with the first surface connecting to the flat cable member up and the supply of the fluid with the back of the flat cable member up, a reinforcing material (also serving as a sealing material) having no interface in the middle can be formed on both sides of the flat cable member. This also allows use of low-viscosity sealing resin which was unavailable.

In the embodiments, the flat cable member such as the FPC and the TCP is not subjected to a special process such as providing a hole for pouring resin. Since such special process is not necessary, cost reduction can be achieved.

The depth B and the width C of the FPC recess 6 of the fluid-flow preventive upper jig 5, shown in FIG. 4D, and the depth B2 and the width C2 of the TCP recesses 15 of the fluid-flow preventive upper jig 5, shown in FIG. 8D, are not particularly limited but may be set in any depth and width.

The size of the PCB recess 10, shown in FIGS. 7A to 8D, is not particularly limited but may be set in any width, length, and thickness.

The surfaces of the fluid-flow preventive jigs 5 and 5 which are in contact with the fluid may be subjected to Teflon coating to improve the release characteristics for the fluid.

EXAMPLES

While examples of the invention will be specifically described hereinafter with reference to the drawings, the invention is not limited to the examples.

First Examples

Figure 9:
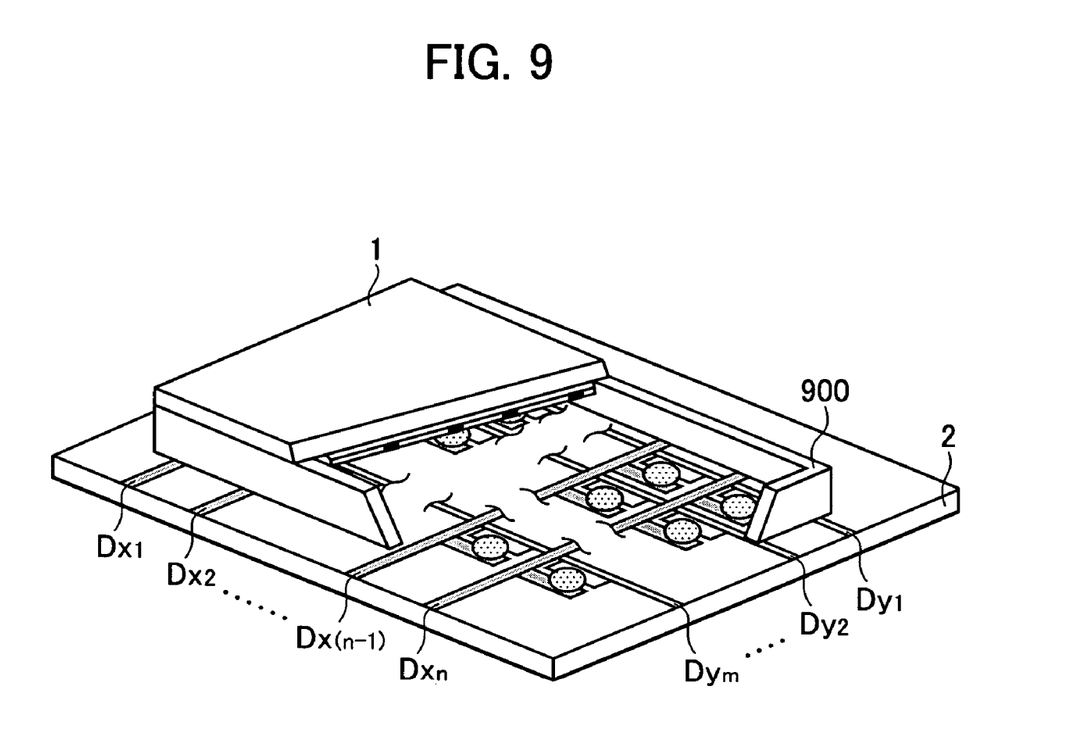
FIG. 9 is a schematic perspective view of a display panel to which a flat cable member is to be connected.

An image forming apparatus shown in FIG. 9 was produced by way of a first example of the invention. In this example, a plurality of surface-conductive electron emission elements that is cold-cathode electron emission elements is formed on the rear plate as electron emission elements; a fluorescent substance is formed on the face plate, thereby producing a color-image forming apparatus having an aspect ratio of 3 to 4 with an effective display area having a width across corner of 15 inches. The image forming apparatus of this invention will first be described with reference to FIG. 9.

FIG. 9 is a schematic partially cut-away perspective view of the image forming apparatus of the example, wherein reference numeral 1 denotes a face plate, numeral 2 denotes a rear plate, and numeral 900 denotes a frame provided between the face plate 1 and the rear plate 2. The face plate 1, the rear plate 2, and the frame 900 construct a display panel. N×M surface-conductive electron emission elements are provided on the rear plate 2 as electron emission elements that construct display devices (N and M are positive integers of 2 or more, which are set as appropriate depending on the target number of display pixels. It is desirable to set N=3,000 and M=1,000 or more for a display unit directed to high-definition television display. In this example, N=333 and M=250 were set). The N×M surface-conductive electron emission elements are formed of M longitudinal wires (also referred to as lower wires) Dy1 to Dym and N vertical wires (also referred to as upper wires) Dx1 to Dxn in simple matrix form. A fluorescent substance that emits light by irradiation with electrons from the electron emission elements is disposed on the face plate 1. FIG. 9 shows the face plate 1, the rear plate 2, the frame 900, the longitudinal wires, the vertical wires, and surface-conductive electron emission elements.

The wires formed on the rear plate 2 is led out of the inner space defined by the face plate 1, the rear plate 2, and the frame 900, to which the flat cable member of the invention is connected.

The principal structure of the image forming apparatus has been described which incorporates the sealing process of the invention to the connection between the flat cable member and the display panel. The sealing process of the invention for the connection between the flat cable member and the display panel will now be described with reference to FIGS. 1A to 4D.

The display panel is first formed. Subsequently, the flat cable member is connected to an electrical connection terminal in the vicinity of the ends of the led wires Dx1 to Dxn and the Dy1 to Dym through an ACF by thermo compression bonding.

A reinforcing section is then formed of fluid resin. The process is carried out by the method described with reference to FIGS. 1A to 4D. Particularly, for the purpose of reinforcement and perfect sealing, the connection (the portion where the wires and the conductive material of the flat cable member are joined together through the ACF) is coated with a reinforcing material and also the entire exposed portions of the led wires and the conductive material of the flat cable member are coated with a reinforcing material. If the sealing is not needed, the reinforcing material may be provided at a position apart from the connection.

Figure 3C:
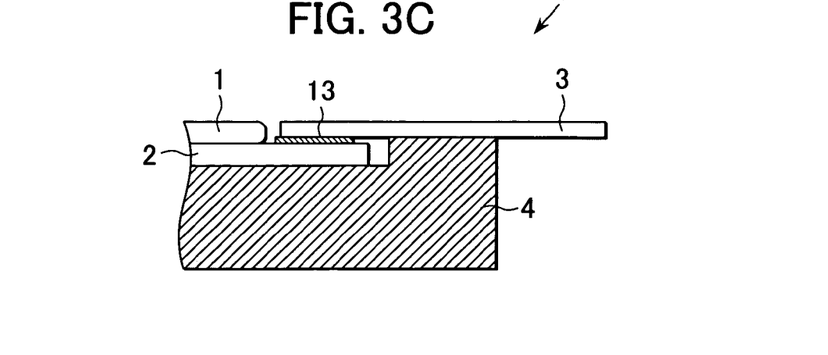
FIG. 3C is a partially enlarged cross-sectional view of the lower jig.

As shown in FIGS. 3A to 3C, the display panel to which the FPC 3 has been connected is placed on the step 4a of the fluid-flow preventive lower jig 4 such that the FPC 3 is placed on the peripheral surface of the recessed step 4a, which are positioned so that clearance A of the order of 1 to 5 mm is formed between the side connected to the FPC 3 and the fluid-flow preventive lower jig 4, as shown in FIG. 3A. The fluid-flow preventive upper jig 5 in which the several FPC recesses 6 having a depth B and a width C are formed in sequence, as shown in FIG. 4D, is put over the fluid-flow preventive lower jig 4, as shown in FIGS. 1A to 2. At that time, the FPC connection surface on the periphery of the display panel and the clearance A are exposed from the opening 5a of the fluid-flow preventive upper jig 5.

As shown in FIG. 1A, the fluid 12 is applied to the FPC connection surface on the rear plate 2 on the periphery of the display panel and the clearance A between the display panel and the fluid-flow preventive jigs 4 and 5 with the fluid-applying syringe 11. As the fluid, a two-liquid room-temperature-setting silicone-resin curing agent was used which is adjusted to have a viscosity of 25 Pa·s by adding diluent, e.g., 10% thinner to dilute the curing agent. Since the viscosity greatly changes depending on temperature, ambient temperature was controlled so that the viscosity can be held at 25±5 Pa·s until the fluid spreads all over the reinforcing section. As such, the fluid was supplied in as state in which the temperature of the display panel, the flat cable member, and the jigs was held constant at a temperature that agrees with the ambient temperature. The applied fluid 12 flows onto the first surface 13 to which the FPC 3 is connected and the second surface which is the back of the FPC 3 (refer to FIG. 3C) by capillary action, thereby sealing the FPC connection. The fluid-flow preventive section of the jigs to be in contact with the fluid was subjected to release-characteristics improving process (Teflon coating in this example) to improve the release characteristics at the time of disengagement after the fluid was dried. In this example, although surface-conductive electron emission elements were used as the electron emission elements, the invention is not limited to that.

In the image display unit which has been completed through the foregoing process, display can be performed. An endurance test of approximately 1,000 hours and a temperature cycling test were performed to determine the heat-resistance cycling lifetime of the connection terminal of the flat cable member in a high-temperature high-humidity environment chamber. In the temperature cycling test, the test object was placed alternately in two constant-temperature chambers whose inside temperature was set at −40 degrees and 125 degrees for 30 minutes each, which was performed 1,000 cycles. In this way, the endurance was determined in terms of appearance and electricity by setting the connection terminal of the flexible substrate to receive a rapid great thermal stress by alternately exposing it to cold and hot temperature.

As a result, there was no significant degradation in appearance, no significant increase in electrical continuity resistance, and no significant decrease in insulation resistance between adjacent wires. Also, image display was stable.

Second Example

A second example of the invention will next be described. While the first example is for the case of using an FPC as a flat cable member, the second example is for the case of using a TCP or a PCB as a flat cable member. The second example is almost the same as the first example except that the shape of the jig is partly changed. Points different from the first example will therefore be described and the same components as those of the first embodiment will be given the same reference numerals and their description will be omitted here.

Referring to FIGS. 5A to 8D, a vacuum vessel is formed such that the face plate 1 in which a fluorescent layer (not shown) and a metal back (not shown) are formed on a glass substrate and the rear plate 2 having an electron source (not shown) including an electron emitting section and a spacer (not shown) are tightly bonded together in a vacuum chamber. The TCP 7 is connected to the lead-wire electrode section of the display panel by thermo compression bonding etc. The integrated circuit 9 for driving the display panel is placed on the PCB 8. The fluid-flow preventive lower jig 4 has the step 4*a* for mounting the display panel and the PCB recess 10 for relieving the thickness of the PCB 8. The fluid-flow preventive upper jig 5 has the FPC recess 6 for relieving the thickness of the TCP 7 and the PCB recess 10. Reference numeral 11 denotes a fluid-applying syringe. Numeral 12 denotes a fluid.

As shown in FIGS. 6 to 7C, the display panel to which the TCP 7 and the PCB 8 are connected is placed on the step 4*a* of the fluid-flow preventive lower jig 4 such that the TCP 7 and the PCB 8 are placed on the peripheral surface of the recessed step 4*a*, which are positioned so that clearances A2 and A3 of the order of 1 to 5 mm are formed between the sides connected to the TCP 7 and the PCB 8 and the fluid-flow preventive lower jig 4, as shown in FIG. 7A. The fluid-flow preventive upper jig 5 in which the several TCP recesses 15 having a depth B2 and a width C2 are formed in sequence, as shown in FIG. 8D, and the PCB recess 10 is formed so as to connect to the TCP recesses 15 is put over the fluid-flow preventive lower jig 4, as shown in FIGS. 5A to 6. At that time, the TCP connection surface on the periphery of the display panel and the clearances A2 and A3 are exposed from the opening 5*a* of the fluid-flow preventive upper jig 5.

As shown in FIG. 5A, the fluid 12 is applied to the TCP connection surface on the face plate 1 and the clearances A2 and A3 between the display panel and the fluid-flow preventive jigs 4 and 5 with the fluid-applying syringe 11. The applied fluid 12 flows onto the first surfaces 16 and 18 to which the TCP 7 is connected (refer to FIGS. 5B and 7C) and the second surface which is the back of the TCP 7 (refer to FIG. 7C) by capillary action, thereby sealing the TCP connection to form the display panel. When an image was formed as in the first example, the same result was obtained.

According to the embodiments of the invention, high-liquidity fluid can be used, allowing the fluid to be sufficiently supplied to a portion to form a reinforcing material. The fluid can be supplied also to a region where a flat cable member is placed with a supply section (the nozzle of the fluid-applying syringe) sandwiched therebetween irrespective of the position of the supply section when the fluid is supplied, simplifying the fluid supply process.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for reinforcing the connection between a wire formed on a substrate and a flat cable member with a reinforcing material, comprising the steps of:
    preparing a device which has the wire, the substrate and the flat cable member, wherein the wire formed on the substrate and the flat cable member are connected;
    supplying fluid to a region in which the reinforcing material is to be formed, while preventing the outflow of the fluid with the jig when the jig and the substrate are close to each other; and
    hardening the fluid to form the reinforcing material.

2. A method for reinforcing the connection of the flat cable member according to claim 1, wherein the step of supplying the fluid further comprises the step of supplying the fluid while preventing the outflow of the fluid with a specified surface of the jig, with the jig and the substrate disposed such that the specified surface of the jig is in nonparallel to a first surface of the substrate to which the flat cable member is connected.

3. A method for reinforcing the connection of the flat cable member according to claim 2, wherein the specified, surface, a second surface opposing to the specified surface, and the bottom of a region sandwiched byte surfaces construct a recess and the recess is supplied with the fluid.

4. A method for reinforcing the connection of the flat cable member according to claim 2, wherein the end face of the substrate, the specified surface, and the bottom of the region sandwiched by the aces construct a recess and the recess is supplied with the fluid.

5. A method for reinforcing the connection of the flat cable member according to claim 2, wherein the jig has a recessed shape in which the substrate is to be disposed and the wall of the recess is used as the specified surface.

6. A method for reinforcing the connection of the flat cable member according to claim 1, wherein the jig is constructed of a lower jig and an upper jig and the fluid is supplied, with the flat cable member released from between the lower jig and the upper jig.

7. A method for reinforcing the connection of the flat cable member according to claim 1, wherein the reinforcing material is formed on opposite sides of the flat cable member.

8. A method for reinforcing the connection of the flat cable member according to claim 1, wherein the reinforcing material is formed so as to seal an exposed portion of the conductor of the flat cable member, the wire, or both of the exposed portion and the wire from an atmosphere.

9. A method for manufacturing an image display unit, comprising the steps of:
    connecting a flat cable member to a wire formed on the substrate of a display panel; and
    reinforcing the connection of the flat cable member, wherein the reinforcing step is executed by the method for reinforcing the connection of the flat cable member according to claim 1.

* * * * *

UNITED STATES PATENT AND TRADEMARK OFFICE
CERTIFICATE OF CORRECTION

PATENT NO. : 7,032,309 B2
APPLICATION NO. : 10/861256
DATED : April 25, 2006
INVENTOR(S) : Koji Hirano It is certified that error appears in the above-identified patent and that said Letters Patent is hereby corrected as shown below:

COLUMN 1:
Line 48, "passing through" should read -- passing through --.

COLUMN 6:
Line 51, "jigs 5 and 5" should read -- jigs 4 and 5 --.

COLUMN 7:
Line 31, "is led" should read -- are led --.

COLUMN 8:
Line 16, "in as" should read -- in a --.

COLUMN 10:
Line 24, "byte surface" should read -- by the surfaces --; and
Line 29, "the aces" should read -- the surfaces --.

Signed and Sealed this

Sixteenth Day of January, 2007

JON W. DUDAS
*Director of the United States Patent and Trademark Office*